United States Patent [19]
Nakasuji

[11] Patent Number: 5,751,538
[45] Date of Patent: May 12, 1998

[54] MASK HOLDING DEVICE AND METHOD FOR HOLDING MASK

[75] Inventor: Mamoru Nakasuji, Yokohama, Japan

[73] Assignee: Nikon Corporation, Tokyo, Japan

[21] Appl. No.: 721,629

[22] Filed: Sep. 26, 1996

[51] Int. Cl.$^6$ ................................................. H02N 13/00
[52] U.S. Cl. ................................................. 361/234
[58] Field of Search ........................... 361/233, 234; 279/128

[56] References Cited

U.S. PATENT DOCUMENTS

| | | | |
|---|---|---|---|
| 3,330,252 | 7/1967 | Oberg | 361/234 |
| 4,194,233 | 3/1980 | Jones et al. | 361/233 |
| 4,502,094 | 2/1985 | Lewin et al. | 361/234 |
| 4,692,836 | 9/1987 | Suzuki | 361/234 |
| 4,733,632 | 3/1988 | Ohmi et al. | 361/234 |
| 5,110,438 | 5/1992 | Ohmi et al. | 156/345 |
| 5,189,306 | 2/1993 | Frei . | |
| 5,532,903 | 7/1996 | Kendall | 361/234 |

FOREIGN PATENT DOCUMENTS

| | | |
|---|---|---|
| 3-102814 | 4/1991 | Japan . |
| 3-187240 | 8/1991 | Japan . |
| 4-49879 | 2/1992 | Japan . |
| 4-71350 | 3/1992 | Japan . |

*Primary Examiner*—Fritz Fleming
*Attorney, Agent, or Firm*—Cushman, Darby & Cushman IP Group of Pillsbury, Madison & Sutro LLP

[57] ABSTRACT

A mask holding device of a charged particle beam projecting apparatus for projecting a pattern of a mask on a radiation sensitive substrate by means of a charged particle beam includes an electrostatic chuck for holding the mask, and a conductive member for grounding the mask. The electrostatic chuck has an aperture through which the charged particle beam passes after being transmitted through the mask, and includes an electrode or electrodes for producing an electrostatic force between the mask and the electrostatic chuck so as to attract and hold the mask onto the electrostatic chuck. The conductive member covers at least a portion of the electrostatic chuck which defines the aperture.

12 Claims, 3 Drawing Sheets

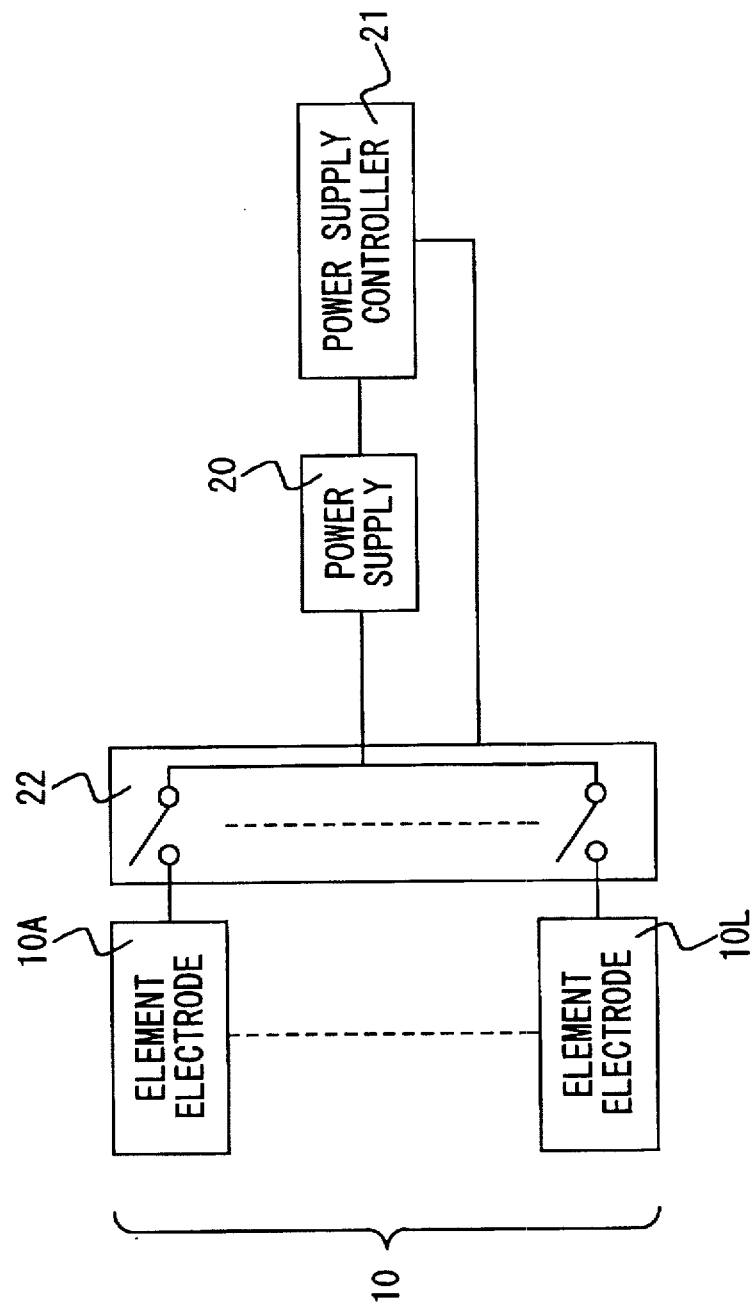

MASK HOLDING DEVICE AND METHOD FOR HOLDING MASK

BACKGROUND OF THE INVENTION

1. Field of the Invention

The present invention relates to a mask holding device of a charged particle beam projecting apparatus for projecting a pattern of a mask on a radiation sensitive substrate by means of a charged particle beam, and also relates to a method of holding the mask.

2. Description of Related Art

As devices for holding a plate- or sheet-like sample, such as a semiconductor wafer, there are known a device wherein the sample is mechanically fixed by claws, for example, and a device using an electrostatic chuck wherein the sample is fixed by electrostatic force. When such known devices are used for holding a mask of a charged particle beam projecting apparatus, a desired pattern cannot be projected with high accuracy due to the following reasons:

(a) When the apparatus projects the pattern while a stage on which the holding device is mounted is continuously moved at a high speed, the mask holding device experiences a large acceleration of 1 G or greater. In the holding device that mechanically holds the mask, therefore, the mask and holding device may be mechanically shifted relative to each other. And also the mask is positioned in a magnetic field produced by an electromagnetic lens in many cases. When a thick metal component is moved at a high speed in the magnetic field, an eddy current is generated on the component, and a problem arises that a charged particle beam is unexpectedly deflected by the magnetic field produced by the eddy current.

(b) In the known holding device using the electrostatic chuck, an electric field produced by an electrode may leak into a path of a charged particle beam, or a surface of an insulator of the electrostatic chuck may be charged by charged particles of the beam, whereby the charged particle beam suffers from astigmatism or drift of the beam position.

(c) If the mask to be held by the electrostatic chuck has warp, e.g., if the mask protrudes upwards to form a convex shape, a peripheral portion of the mask which is in contact with the chuck is initially attracted to the chuck. As a result, the peripheral portion of the mask cannot slide due to the frictional force between the mask and the electrostatic chuck, and the pattern projection is effected while the warp remains in a central portion of the mask in which the pattern is formed.

SUMMARY OF THE INVENTION

It is therefore an object of the present invention to provide a mask holding device which enables a charged particle beam projecting apparatus to project a desired pattern with high accuracy, and a method of holding a mask.

To accomplish the above object, there is provided a mask holding device of a charged particle beam projecting apparatus for projecting a pattern of a mask on a radiation sensitive substrate by means of a charged particle beam, comprising: an electrostatic chuck having an aperture through which the charged particle beam passes after being transmitted through the mask, the electrostatic chuck including at least one electrode for producing an electrostatic force between the mask and the electrostatic chuck so as to attract and hold the mask onto the electrostatic chuck; and a conductive member for grounding the mask, which member covers at least a portion of the electrostatic chuck which defines the aperture.

According to another aspect of the present invention, there is provided a mask holding device of a charged particle beam projecting apparatus for projecting a pattern of a mask on a radiation sensitive substrate by means of a charged particle beam, comprising: a chuck body for holding the mask, the chuck body having an aperture through which the charged particle beam passes after being transmitted through the mask; a plurality of electrodes provided in the chuck body, for producing an electrostatic force between the chuck body and the mask so as to attract and hold the mask onto the chuck body; a power supply that applies a voltage to each of the plurality of electrodes so as to produce the electrostatic force; and a power supply controller that controls the power supply to apply the voltage to the plurality of electrodes in a predetermined order, so that a portion of the mask is first electrostatically attracted to the chuck body, and other portions of the mask are successively attracted to the chuck body so as to expand an area of the mask attracted to the chuck body from the portion of the mask.

According to a further aspect of the present invention, there is provided a method of holding a mask of a charged particle projecting apparatus for projecting a pattern of the mask on a radiation sensitive substrate by means of a charged particle beam, the charged particle projecting apparatus including a chuck body for holding the mask, which has an aperture through which the charged particle beam passes after being transmitted through the mask, and a plurality of electrodes provided in the chuck body, for producing an electrostatic force between the chuck body and the mask so as to attract and hold the mask onto the chuck body, which method comprises steps of: applying a voltage to a part of the plurality of electrodes so that a first portion of the mask is electrostatically attracted to the chuck body; and successively applying the voltage to a remainder of the plurality of electrodes in a predetermined order, such that an area of the mask attracted to the chuck body gradually expands from the first portion to adjacent portions thereof.

BRIEF DESCRIPTION OF THE DRAWINGS

This invention will be described in greater detail with reference to a certain preferred embodiment thereof and the accompanying drawings, wherein:

FIG. 2 is a block diagram showing the relationship between an electrode and a power supply.

DESCRIPTION OF THE PREFERRED EMBODIMENT

Figure 1A:
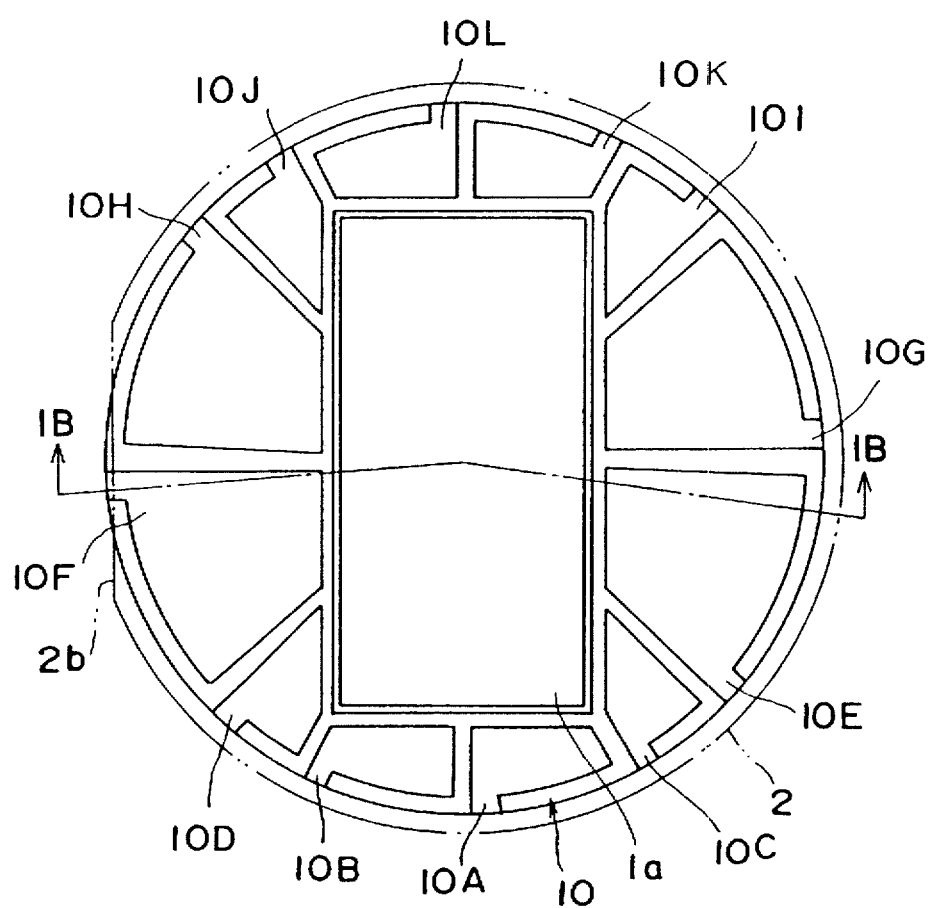
FIG. 1A is a plan view showing a mask holding device constructed according to the present invention.
Figure 1B:
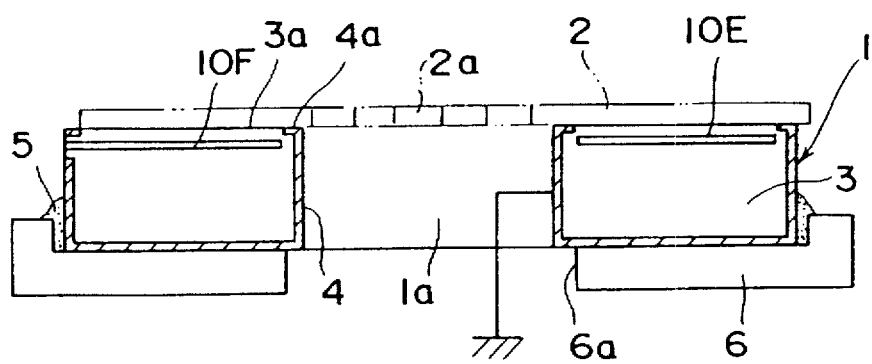
FIG. 1B is a cross sectional view taken along line A—A of FIG. 1A.

There will be described one embodiment of the present invention referring to FIG. 1A, FIG. 1B and FIG. 2. FIG. 1A is a plan view of a mask holding device according to the present invention, and FIG. 1B is a cross sectional view taken along line A—A of FIG. 1A. FIG. 2 is a block diagram showing the relationship between an electrode and a power supply for applying voltage to the electrode. Reference numeral 1 denotes an electrostatic chuck for holding a mask 2 as indicated by a two-dot chain line in FIG. 1B. The electrostatic chuck 1 includes a chuck body 3 made of a ceramic material, and an electrode 10 consisting of element electrodes 10A–10L which are formed with titanium for example by thin film or thick film technology is disposed within the chuck body 3. For easy understanding, the element electrodes 10A–10L are indicated by solid lines in FIG. 1A. The element electrodes 10A–10L are connected to a power supply 20 as shown in FIG. 2, such that a voltage of −300 V is applied to each of the element electrodes 10A, 10C, 10E, 10G and 10I, and a voltage of +300 V is applied to each of the element electrodes 10B, 10D, 10F, 10H, 10J and 10L. A power supply controller 21 (FIG. 2) controls the power supply 21 and a switch 22 to control the order and other conditions in which the voltages are applied to the respective electrodes 10A–10L.

In the middle portion of the electrostatic chuck 1 is formed a rectangular aperture 1a that corresponds to a pattern portion 2a of the mask 2. A titanium (Ti) coating film 4 having a thickness of about 100 nm is applied by sputtering to side and bottom faces of the chuck body 3 including those defining the aperture 1a, but not to its upper face 3a onto which the mask 2 is to be attracted. A part of the upper face 3a of the chuck body 3, however, is coated with the titanium coating film 4 so that a part 4a of the titanium coating film 4 comes into contact with the mask 2 when the mask 2 is attracted to the electrostatic chuck 1. Since this coating film 4 is grounded with its part 4a being in contact with the mask 2, the potential of the coating film 4 and mask 2 is held at the ground potential, i.e., 0V. The electrostatic chuck 1 is bonded to a mask stage 6 with an adhesive 5, and an aperture 6a corresponding to the aperture 1a of the electrostatic chuck 1 is formed through the mask stage 6. The coating film 4 may be grounded by providing the coating film 4 with an earth wire, and connecting the earth wire to the earth of the device. In another grounding method, the mask stage 6 may be formed of a conductive material, and the coating film 4 may be connected to the earth of the device through the conductive mask stage 6.

There will be described a mask holding operation of the electrostatic chuck constructed as described above. After the mask 2 is positioned on the electrostatic chuck 2 using an orientation flat 2b formed in the mask 2, for example, a voltage of −300 V is applied to the element electrode 10A while a voltage of +300 V is applied to the element electrode 10B. Upon a lapse of 0.5 seconds after starting of the voltage application, during which the voltages are kept applied to the element electrodes 10A and 10B, the voltage application is started with respect to the element electrodes 10C and 10D located adjacent to the element electrodes 10A and 10B. Similarly, the voltage application is started at intervals of 0.5 seconds with respect to "element electrode 10E and element electrode 10F", "element electrode 10G and element electrode 10H", "element electrode 10I and element electrode 10J", and "element electrode 10K and element electrode 10L" in the order of description. Finally, the voltages are applied to all of the element electrodes 10A–10L. In this manner, a portion of the mask 2 that faces the element electrodes 10A and 10B is initially attracted to these electrodes 10A, 10B, and its portions facing the adjacent element electrodes are then successively attracted to the respective electrodes. Finally, a portion of the mask 2 that faces the element electrodes 10K, 10L is attracted to these electrodes 10K, 10L so that the mask 2 as a whole is fixedly held by the electrostatic chuck 1. Namely, the mask 2 is not entirely attracted to the chuck 1 at the same time, but attracted little by little in a direction from one of its opposite end portions toward the other. Consequently, warp of the mask 2, if any, can be rectified or eliminated as the mask 2 is initially attracted to the chuck 1 at its end portion and then successively attracted thereto at its adjacent portions and further portions. Thus, the mask 2 is prevented from being attracted to and held by the electrostatic chuck 1 such that the warp remains in the mask 2.

While the voltages are applied first to the element electrodes 10A, 10B and lastly to the element electrodes 10K, 10L in the present embodiment, it may be applied in the reverse order. It is also possible to apply the voltages first to the element electrodes 10A, 10K, then to the element electrodes 10B, 10L and 10C, 10I located on both sides of each of the electrodes 10A, 10K. The voltage is then successively applied to the element electrodes located on both sides of these electrodes 10B, 10L, 10C, 10I. In summary, a portion of the mask 2 may be first attracted to the electrostatic chuck 1, and then its adjacent portions and further portions may be successively attracted to the chuck 1, such that an area of the mask 2 attracted to the chuck 1 gradually expands until the entire area of the mask 2 is attracted to the chuck 1.

In this manner, the voltages are applied to all of the element electrodes 10A–10L so that the mask 2 is held by the electrostatic chuck 1. Thereafter, the pattern of the mask 2 is projected onto a wafer or other radiation sensitive substrate (not shown), by irradiating the pattern portion 2a of the mask 2 from above as viewed in the FIG. 1B with a charged particle beam. The charged particle beam that has been transmitted through the pattern portion 2a passes through the aperture 1a of the electrostatic chuck 1 and the aperture 6a of the mask stage 6, and then reaches the wafer (not shown). Upon completion of the projecting work on the wafer, the voltages applied to the element electrodes 10A–10L are set at 0V at the same time, and the mask 2 is removed from the electrostatic chuck 1.

Since the mask stage 6 is continuously moved at a high speed during projection of the pattern, the electrostatic force of the electrostatic chuck 1 is determined to satisfy the following inequality (1) so as not to cause the positions of the mask 2 and electrostatic chuck 1 to be shifted relative to each other.

(Mask mass)×(acceleration)<<(electrostatic force)×(coefficient of static friction) . . .  (1)

In the above inequality, the term "acceleration" means an acceleration experienced by the mask 2, and the term "coefficient of static friction" means that of the friction between the mask 2 and the electrostatic chuck 1. If the mask 2 has a diameter of 8 inches and a thickness of 1 mm, with its area of contact with the chuck 1 being 100 cm$^2$, and the coefficient of static friction is 0.1 while the acceleration is 1 G, the mass of the mask 2 becomes about 110 g. Since a typical electrostatic chuck has an electrostatic force of about 100 gf/cm$^2$, the left side and the right side of the above inequality (1) will be as follows.

(Left side)=110(gf) . . .  (2)

(Right side)=100(gf/cm$^2$)×100(cm$^2$)×0.1=1000 (gf) . . .  (3)

Thus, the inequality (1) is satisfied, and there arises no relative positional shift between the mask 2 and the electrostatic chuck 1.

Further, the element electrodes 10A–10L are shielded by the Ti coating film 3 that is grounded. Therefore, electric fields produced by the element electrodes 10A–10L do not leak into the aperture 1a, namely, a path of the charged particle beam. Although the path of the charged particle beam is bent while being transmitted through the pattern portion 2a, and part of charged particles of the beam collide with a wall of the aperture 1a of the electrostatic chuck 1, the chuck 1 is not charged since the wall of the aperture 1a is coated with the Ti coating film 4, and the film 4 is grounded so that the charges on the charged particles are led to the ground. As a result, the charged particle beam is free from astigmatism and drift of the beam position, thereby enabling the pattern to be projected with high accuracy.

Moreover, the element electrodes 10A–10L and the coating film 4 are formed with thin films or thick films, and made, for example, of Ti which has relatively big electrical resistivity. Consequently, even if they move at high speed in the magnetic field, an eddy current is generated on them only in a very small amount and the strength of the magnetic field produced by this eddy current is too small to deflect the charged particle beam. As a result, the pattern can be projected with high accuracy.

While twelve discrete element electrodes 10A–10L are used in the illustrated embodiment, the number of the element electrodes is not limited to twelve, but may be determined as desired. While the application of the voltage takes place at intervals of 0.5 seconds in the illustrated embodiment, the condition(s) under which the voltage is applied may be suitably determined depending upon the size of the wafer, the size and number of the element electrodes and others. The coating film 4 may be made of a metal other than titanium (Ti), for example titanium alloy or manganese. Moreover, the coating film 4 may be formed with a semiconductor material, such as germanium or silicon, by the CVD method. Further, the coating film may also be replaced by a thin metallic plate which is secured to faces of the chuck body 3 other than its face 3a that attracts the mask 2, such that a part of the metallic plate is in contact with the mask 2. This metallic plate may be made of titanium, titanium alloy, manganese or the like, and have a relatively big electrical resistivity, for example more than 150 ohm-m volume resistivity, and a thickness less than 10 μm. The above-described method in which an area of the mask 2 attracted to the chuck 1 gradually expands until the entire area of the mask 2 is attracted to the chuck 1 by a plurality of electrodes may be applied to an exposure apparatus other than the charged particle beam apparatus.

What is claimed is:

1. A mask holding device of a charged particle beam projecting apparatus for protecting a pattern of a mask on a radiation sensitive substrate by means of a charged particle beam, comprising:

an electrostatic chuck having an aperture through which said charged particle beam passes after being transmitted through said mask, said electrostatic chuck including at least one electrode for producing an electrostatic force between said mask and said electrostatic chuck so as to attract and hold the mask onto the electrostatic chuck; and a conductive member that grounds said mask and covers at least a portion of said electrostatic chuck which defines said aperture.

2. A mask holding device as defined in claim 1, wherein said electrode is formed with a thin film or thick film.

3. A mask holding device as defined in claim 1, wherein said conductive member comprises a metallic plate which is thin and an electrical resistivity of which is relatively big.

4. A mask holding device as defined in claim 1, wherein said conductive member comprises a conductive coating film which is made of a semiconductor.

5. A mask holding device as defined in claim 1, wherein said conductive member comprises a conductive coating film an electrical resistivity of which is relatively big.

6. A mask holding device of a charged particle beam projecting apparatus for projecting a pattern of a mask on a radiation sensitive substrate by means of a charged particle beam, comprising:

a chuck body for holding said mask, said chuck body having an aperture through which the charged particle beam passes after being transmitted through the mask;

a plurality of electrodes provided in said chuck body, for producing an electrostatic force between the chuck body and said mask so as to attract and hold the mask onto the chuck body;

a power supply that applies a voltage to each of said plurality of electrodes so as to produce the electrostatic force; and a power supply controller that controls said power supply to apply the voltage to said plurality of electrodes in a predetermined order, so that a portion of said mask is first electrostatically attracted to said chuck body, and other portions of the mask are successively attracted to the chuck body so as to expand an area of the mask attracted to the chuck body from said portion of said mask.

7. A mask holding device as defined in claim 6, further comprising a conductive member that grounds said mask and covers at least a portion of said chuck body that defines said aperture.

8. A mask holding device as defined in claim 6, wherein said power supply controller controls said power supply so that said mask is electrostatically attracted to said chuck body in a manner in which one of end portions of the mask is initially attracted, and an area of the mask attracted to the chuck body expands from said one of end portions toward another one of said end portions.

9. A mask holding device as defined in claim 6, wherein said power supply controller controls said power supply such that said mask is electrostatically attracted to said chuck body in a manner in which a portion of the mask along a center line of the mask is initially attracted, and an area of the mask attracted to the chuck body expands outward away from said center line.

10. A mask holding device as defined in claim 7, wherein said conductive member is made of a material an electrical resistivity of which is relatively big.

11. A mask holding device as defined in claim 7, wherein said conductive member is made of a material that comprises titanium.

12. A method of holding a mask of a charged particle projecting apparatus for projecting a pattern of the mask on a radiation sensitive substrate by means of a charged particle beam, said charged particle projecting apparatus including: a chuck body for holding the mask, said chuck body having an aperture through which the charged particle beam passes after being transmitted through the mask; and a plurality of electrodes provided in said chuck body, for producing an electrostatic force between the chuck body and the mask so as to attract and hold the mask onto the chuck body, said method comprising steps of:

applying a voltage to a part of said plurality of electrodes so that a first portion of said mask is electrostatically attracted to said chuck body; and successively applying the voltage to a remainder of said plurality of electrodes in a predetermined order, such that an area of said mask attracted to said chuck body gradually expands from said first portion to adjacent portions thereof.

* * * * *